United States Patent [19]

Gray

[11] Patent Number: 4,525,638

[45] Date of Patent: Jun. 25, 1985

[54] ZENER REFERENCED THRESHOLD DETECTOR WITH HYSTERESIS

[75] Inventor: Randall C. Gray, Scottsdale, Ariz.

[73] Assignee: Motorala, Inc., Schaumburg, Ill.

[21] Appl. No.: 571,232

[22] Filed: Jan. 16, 1984

[51] Int. Cl.$^3$ ............................................ H03K 5/153
[52] U.S. Cl. ................................... 307/350; 307/363; 307/359; 307/299 B; 307/318
[58] Field of Search .............. 307/350, 362, 363, 318, 307/359, 299 B, 354

[56] References Cited

U.S. PATENT DOCUMENTS 3,586,879  6/1971  Ford ................................... 307/318
4,258,277  3/1981  Nutz ................................... 307/363
4,385,243  5/1983  Suzuki ................................ 307/363

Primary Examiner—John Zazworsky
Attorney, Agent, or Firm—Vincent B. Ingrassia

[57] ABSTRACT

In a zener referenced voltage threshold detector, the voltage at which a switching transistor turns on is determined by the breakdown voltage of a zener diode coupled between ground and the base of the switching transistor in conjunction with the base-emitter voltage of the switching transistor itself. In order to render the threshold detector circuit immune from noise at the trip point, a portion of the switching transistor's collector current is supplied to a second transistor which when turned on reduces the voltage at the base of the switching transistor.

9 Claims, 1 Drawing Figure

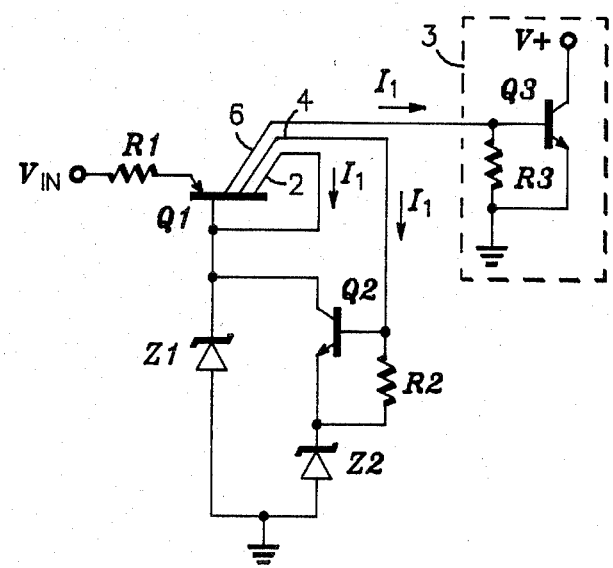

ZENER REFERENCED THRESHOLD DETECTOR WITH HYSTERESIS

BACKGROUND OF THE INVENTION

This invention relates generally to detector circuits and, more particularly, to a zener referenced detector circuit which provides a positive hysteresis effect on the output current resulting in a defined trip point and noise immunity.

Circuits which generate an output when an input signal reaches a predetermined voltage or trip point are well known. It is also well known that if the input voltage is at or very near the trip point, unwanted voltage excursions such as those produced by noise will cause the detector circuit to switch on and off resulting in an undesirable and spurious output.

A detector circuit is known which comprises a PNP dual collector transistor (or first and second single collector PNP transistors coupled so as to operate as a dual collector transistor) having an emitter coupled to the input voltage via a resistor and having a first collector coupled to a load for supplying a current thereto. The base of the transistor is coupled via a zener diode to ground. A second collector of the transistor is coupled to the cathode of the zener diode so as to bias the zener in its breakdown region when current is flowing in the first and second collectors. Thus, when the input voltage reaches a predetermined trip point corresponding to the voltage of the zener diode plus the base-emitter voltage of the transistor ($V_{BE}$) currents will begin to flow in the first and second collectors. These currents will be equal if the collector areas are equal or may be scaled to any desired ratio by properly scaling the collector areas. Unfortunately, if the input voltage is at or near the trip point, unwanted voltage excursions such as noise, will cause the transistor to turn on and off. This may have an adverse effect on the load which is coupled to the first collector of the transistor.

SUMMARY OF THE INVENTION

It is an object of the present invention to provide an improved detector circuit.

It is a further object of the present invention to provide a zener diode referenced detector circuit which provides a positive hysteresis effect on the output current.

According to a broad aspect of the invention there is provided a voltage threshold detector of the type wherein a switching transistor turns on when an input voltage exceeds a predetermined threshold voltage, comprising: switching transistor means having base, emitter and first, second and third collector terminals, said first collector terminal coupled to said base; first impedance means coupled between said emitter terminal of said switching transistor and said input voltage; first diode means having an anode coupled to a first source of supply voltage and a cathode coupled to the base of said switching transistor, said first diode means for establishing, in conjunction with the base-emitter voltage of said switching transistor, the value of said input voltage necessary to turn on said switching transistor; and first means coupled to said second collector for reducing the voltage at the base of said switching transistor after said switching transistor has turned on, said third collector representing the output of said voltage threshold detector.

BRIEF DESCRIPTION OF THE DRAWINGS

The above and other objects, features and advantages of the present invention will be more clearly understood from the following detailed description taken in conjunction with the accompanying drawing which is a schematic diagram of the inventive detector circuit.

DESCRIPTION OF THE PREFERRED EMBODIMENT

Referring to the drawing, PNP switching transistor $Q_1$ is coupled to receive an input signal $V_{in}$ via resistor $R_1$. Transistor $Q_1$ has a first collector 2 ccoupled to the base of transistor $Q_1$, a second collector 4 coupled to the base of transistor $Q_2$ and a third collector 6 coupled to a load indicated by dashed box 8 (for example NPN transistor $Q_3$ coupled between a source of supply voltage V+ and ground and resistor $R_3$ coupled between the base of transistor $Q_3$ and ground. The base of transistor $Q_1$ is coupled to the cathode of zener diode $Z_1$ (e.g. 7 volts) and to the collector of transistor $Q_2$. The anode of zener $Z_1$ is coupled to ground as is the anode of zener diode $Z_2$ (e.g. 5 volts). The emitter of NPN transistor $Q_2$ is coupled to the cathode of zener diode. $Z_2$, and a resistor $R_2$ is coupled between the base and emitter terminals of transistor $Q_2$.

The circuit operates as follows. When the voltage $V_{in}$ starts to exceed the zener voltage of diode $Z_1$ plus the base-emitter voltage ($V_{BE}$) of transistor $Q_1$, $Q_1$ will begin to turn on causing currents to flow in collectors 2, 4 and 6. If each of the collector areas are equal, the currents will be equal. Obviously, however, the currents may be weighted by properly scaling the respective collector areas. It should also be noted that while a multicollector transistor has been shown, individual single collector transistors may be utilized and coupled together so as to function as a multicollector transistor. For the remainder of the discussion, it is assumed that the collector areas are equal and that equal currents $I_1$ will flow in all three collectors.

Current $I_1$ flowing in collector 2 is utilized to assure that zener diode $Z_1$ is operating in its breakdown mode. Similarly, current $I_1$ flowing in collector 4 and resistor $R_2$ assures that zener diode $Z_2$ operates in its breakdown mode. When the voltage across resistor $R_2$ reaches the base-emitter voltage ($V_{BE}$) of transistor $Q_2$, transistor $Q_2$ will turn on diverting current from the base of transistor $Q_1$ resulting in a reduction of the voltage at the base of $Q_1$. As $I_1$ increases, transistor $Q_2$ will eventually saturate causing the voltage at the base of transistor $Q_1$ to equal the breakdown voltage of zener diode $Z_2$ plus the saturation voltage of transistor $Q_2$. It is to be noted, however, that this voltage is less than the voltage of zener diode $Z_1$. Therefore, a delta-voltage has been created between the base of transistor $Q_1$ and the input terminal at which $V_{in}$ is present. Since the base-emitter voltage of transistor $Q_1$ is constant, this delta-voltage (approximately 2 volts) appears across resistor $R_1$.

If, for example, $V_{in}$ were at the trip voltage, transistor $Q_1$ would be ready to turn on. The rising edge of an unwanted voltage excursion or noise spike would cause transistor $Q_1$ to turn on which in turn causes transistor $Q_2$ to saturate creating the delta-voltage across transistor $R_1$. Now, if the noise voltage were to fall back to the trip voltage, approximately 2 volts would still remain across the base-emitter junction of transistor $Q_1$ maintaining it on. Thus, when the input voltage is near the trip voltage, noise spikes are not permitted to cause transistor $Q_1$ to turn on and off due to the action of transistor $Q_2$ and the delta-voltage created across transistor $R_1$.

The load circuit 8, while not considered a part of the invention, is constructed such that transistor $Q_3$ will not turn on until current $I_1$ flowing in collector 6 and resistor $R_3$ has resulted in sufficient base-emitter voltage to turn on transistor $Q_3$.

The above description is given by way of example only. Changes in form and details may be made by one skilled in the art without departing from the scope of the invention.

I claim:

1. A voltage threshold detector of the type wherein a switching transistor turns on when an input voltage exceeds a predetermined threshold voltage, comprising:
   switching transistor means having base, emitter and first, second and third collector terminals, said first collector terminal coupled to said base;
   first impedance means coupled between said emitter terminal of said switching transistor and said input voltage;
   first diode means having an anode coupled to a first source of supply voltage and a cathode coupled to the base terminal of said switching transistor, said first diode means for establishing, in conjunction with the base-emitter voltage of said switching transistor, the value of said input voltage necessary to turn on said switching transistor; and
   first means coupled to said second collector terminal for reducing the voltage at the base terminal of said switching transistor after said switching transistor has turned on, said third collector terminal representing the output of said voltage threshold detector.

2. A voltage threshold detector according to claim 1 wherein said first means comprises
   a first transistor having base, emitter and collector terminals, said base terminal coupled to said second collector terminal and the collector terminal of said first transistor being coupled to the base terminal of said switching transistor;
   second impedance means coupled between the base and emitter terminals of said first transistor; and
   second diode means having an anode coupled to said first source of supply voltage and a cathode coupled to the emitter terminal of said first transistor.

3. A voltage threshold detector according to claim 2 wherein said first diode means is a zener diode having a first predetermined breakdown voltage.

4. A voltage threshold detector according to claim 3 wherein said second diode means is a zener diode having a second predetermined breakdown voltage, said second predetermined breakdown voltage being less than said first predetermined breakdown voltage.

5. A voltage threshold detector according to claim 4 wherein said first impedance means is a resistor.

6. A voltage threshold detector according to claim 5 wherein said second impedance means is a second resistor.

7. A voltage threshold detector according to claim 6 wherein the currents flowing in said first, second and third collectors are substantially equal.

8. A voltage threshold detector according to claim 7 wherein said switching transistor is a multicollector PNP transistor.

9. A voltage threshold detector according to claim 8 wherein said first transistor is an NPN transistor.

* * * * *